(12) United States Patent  
Schultz

(10) Patent No.: US 8,746,000 B2  
(45) Date of Patent: Jun. 10, 2014

(54) INFORMATION TECHNOLOGY EQUIPMENT COOLING SYSTEM

(75) Inventor: Mark D. Schultz, Ossining, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 13/587,912

(22) Filed: Aug. 16, 2012

(65) Prior Publication Data

US 2014/0022725 A1  Jan. 23, 2014

Related U.S. Application Data

(63) Continuation of application No. 13/551,858, filed on Jul. 18, 2012.

(51) Int. Cl.  
*F25D 23/12* (2006.01)

(52) U.S. Cl.  
USPC .......................................... 62/259.2; 62/498

(58) Field of Classification Search  
USPC ................ 62/259.2, 498, 440, 419; 165/80.3, 165/80.4, 104.27, 104.33; 361/694, 696, 361/679.49  
See application file for complete search history.

(56) References Cited

U.S. PATENT DOCUMENTS

| | | | |
|---|---|---|---|
| 2006/0250770 A1* | 11/2006 | Campbell et al. | 361/695 |
| 2007/0227710 A1 | 10/2007 | Belady et al. | |
| 2008/0245506 A1 | 10/2008 | Campbell et al. | |
| 2009/0056910 A1* | 3/2009 | Mallia et al. | 165/80.3 |
| 2009/0086428 A1* | 4/2009 | Campbell et al. | 361/694 |
| 2009/0086432 A1 | 4/2009 | Campbell et al. | |
| 2010/0110634 A1* | 5/2010 | Woodbury et al. | 361/698 |
| 2010/0126696 A1* | 5/2010 | Novotny et al. | 165/67 |
| 2010/0236772 A1 | 9/2010 | Novotny et al. | |

FOREIGN PATENT DOCUMENTS

| | | |
|---|---|---|
| WO | WO 2007098477 A2 | 8/2007 |
| WO | WO 2010112873 A1 | 10/2010 |

OTHER PUBLICATIONS

J. G. Torok et al, "Packaging design of the IBM System z10 Enterprise Class platform central electronic complex", 2009.

* cited by examiner

*Primary Examiner* — Mohammad M Ali  
(74) *Attorney, Agent, or Firm* — Ido Tuchman; Anne V. Dougherty

(57) ABSTRACT

According to one embodiment, a system for removing heat from a rack of information technology equipment may include a sidecar indoor air to liquid heat exchanger that cools warm air generated by the rack of information technology equipment. The system may also include a liquid to liquid heat exchanger and an outdoor heat exchanger. The system may further include configurable pathways to connect and control fluid flow through the sidecar heat exchanger, the liquid to liquid heat exchanger, the rack of information technology equipment, and the outdoor heat exchanger based upon ambient temperature and/or ambient humidity to remove heat from the rack of information technology equipment.

10 Claims, 22 Drawing Sheets

INFORMATION TECHNOLOGY EQUIPMENT COOLING SYSTEM

CROSS-REFERENCE TO RELATED APPLICATIONS

This application is a continuation of and claims priority under 35 U.S.C. §120 to U.S. patent application Ser. No. 13/551,858 ("INFORMATION TECHNOLOGY EQUIPMENT COOLING SYSTEM") filed Jul. 18, 2012.

GOVERNMENT RIGHTS

This invention was made with Government support under Contract No. DE-EE0002894 (awarded by Department of Energy (DOE)). The Government has certain rights in this invention.

BACKGROUND

The disclosure relates to the field of computer systems, and, more particularly, to cooling information technology equipment.

Information technology equipment (IT) includes computer systems and associated subsystems. IT equipment generally generates heat as a byproduct of operation.

SUMMARY

According to one embodiment, a method for removing heat from a rack of information technology equipment may include connecting configurable pathways between a sidecar indoor air to liquid heat exchanger, a liquid to liquid heat exchanger, the rack of information technology equipment, and an outdoor heat exchanger. The method may also include controlling fluid flow through the configurable pathways based upon ambient temperature and/or ambient humidity to remove heat from the rack of information technology equipment.

In another example embodiment, the method for removing heat from a rack of information technology equipment may include connecting configurable pathways between a liquid to liquid heat exchanger, an rack of information technology equipment, an outdoor heat exchanger, and a sidecar heat exchanger positioned upstream and/or downstream of the liquid to liquid heat exchanger. The method may also include controlling fluid flow through the configurable pathways based upon ambient temperature and/or ambient humidity to remove heat from the rack of information technology equipment. The method may further include using a first coolant to flow through the sidecar heat exchanger and the rack of information technology equipment during a first period of time. The method may additionally include using a second coolant to flow through the sidecar heat exchanger and the outdoor heat exchanger during a second period of time.

In another example embodiment, the method for removing heat from a rack of information technology equipment may include connecting configurable pathways between a liquid to liquid heat exchanger, an rack of information technology equipment, an outdoor heat exchanger, and a sidecar heat exchanger positioned upstream and/or downstream of the liquid to liquid heat exchanger. The method may also include controlling fluid flow through the configurable pathways based upon ambient temperature and/or ambient humidity to remove heat from the rack of information technology equipment. The method may further include passing an interior loop through the sidecar heat exchanger and at least one of the liquid to liquid heat exchanger and the rack of information technology equipment. The method may additionally include passing an exterior loop through the sidecar heat exchanger and the outdoor heat exchanger, and the fluid flow within the interior loop and the exterior loop are separate from each other.

DETAILED DESCRIPTION

Embodiments will now be described more fully hereinafter with reference to the accompanying drawings, in which preferred embodiments are shown. Like numbers refer to like elements throughout.

Figure 1:
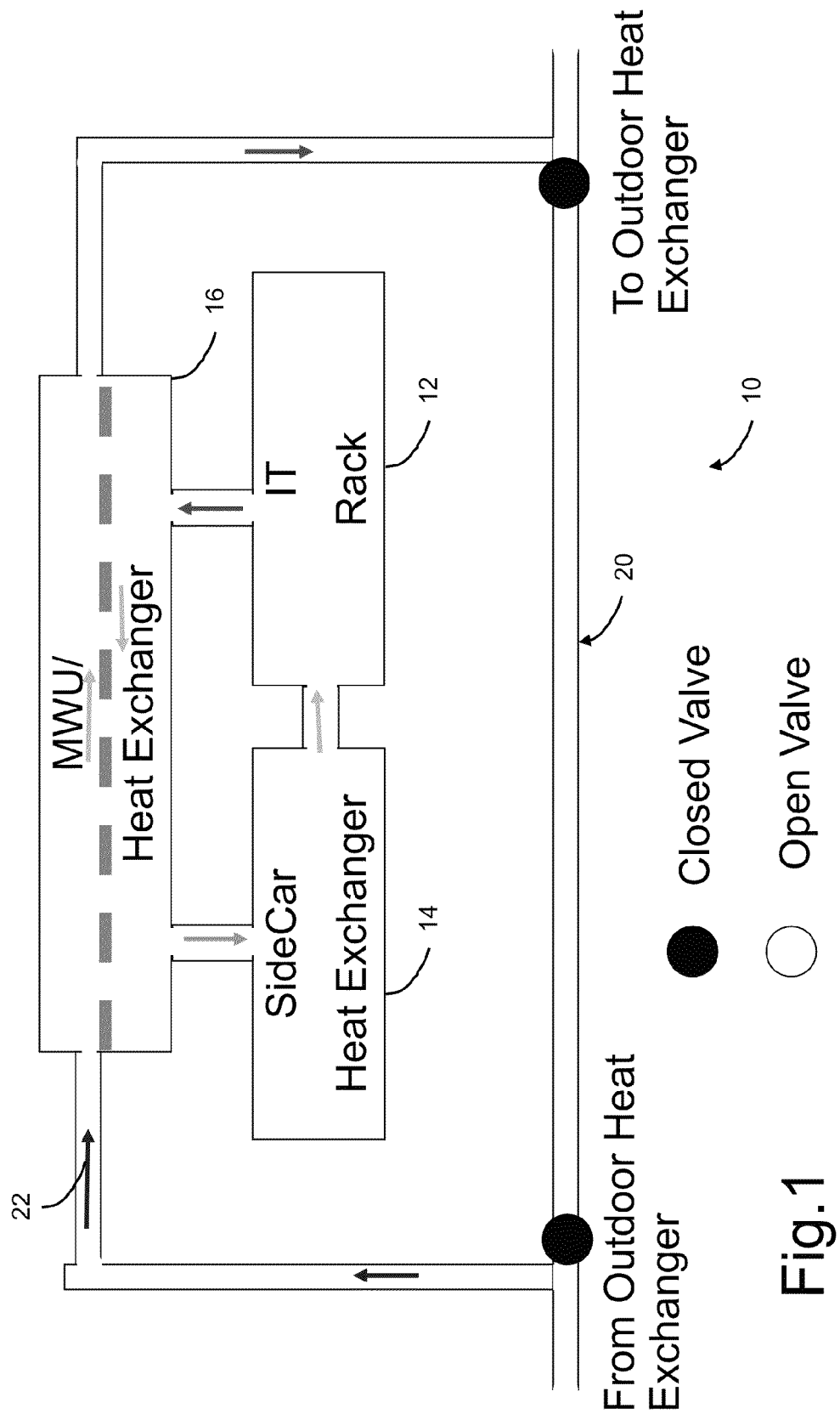
FIG. 1 is a block diagram illustrating a summer dual loop information technology equipment cooling system in accordance with various embodiments.
Figure 2:
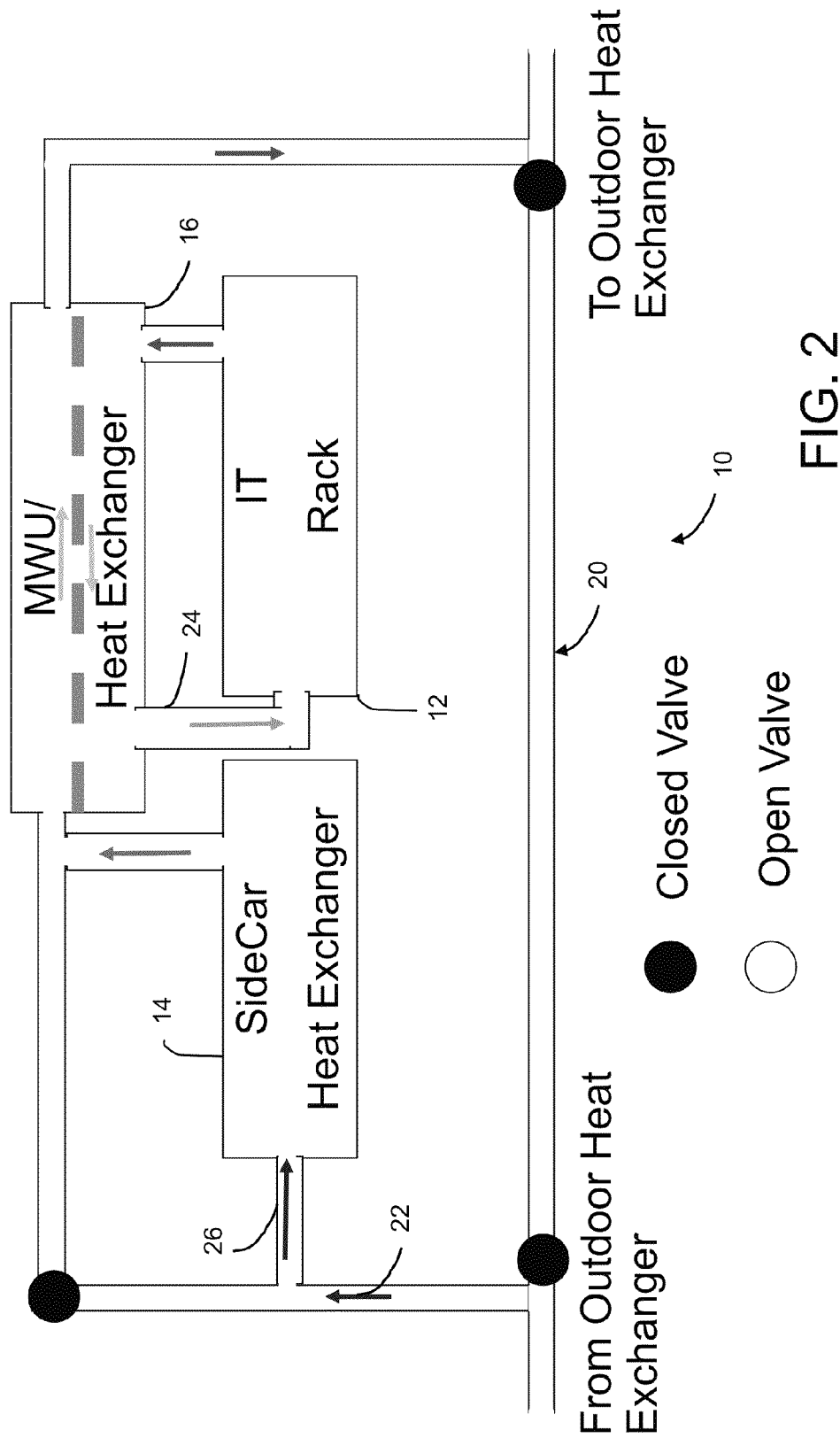
FIG. 2 is a block diagram illustrating an alternate summer dual loop information technology equipment cooling system in accordance with various embodiments.
Figure 3:
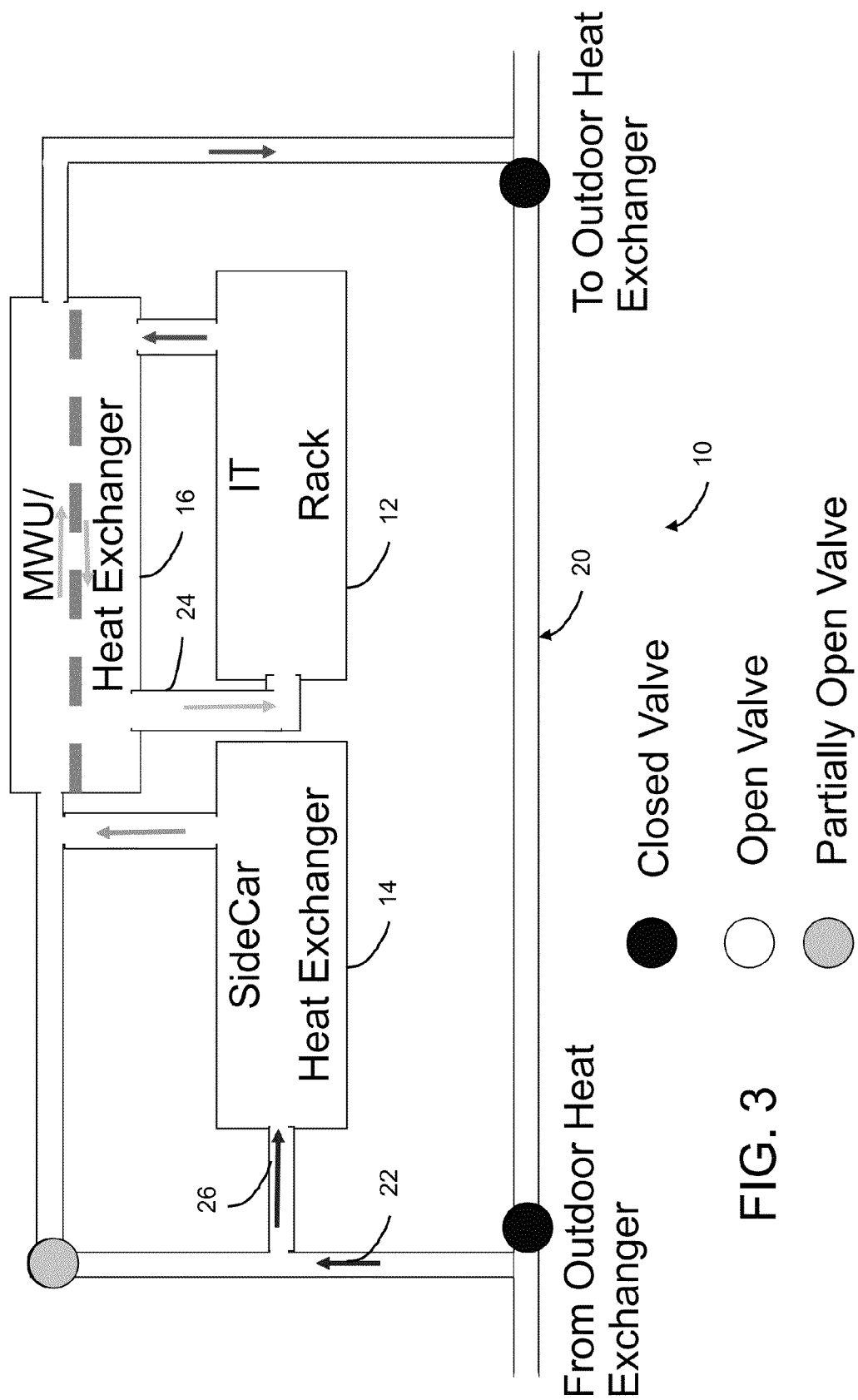
FIG. 3 is a block diagram illustrating another alternate summer dual loop information technology equipment cooling system with a lower pressure drop in accordance with various embodiments.
Figure 4:
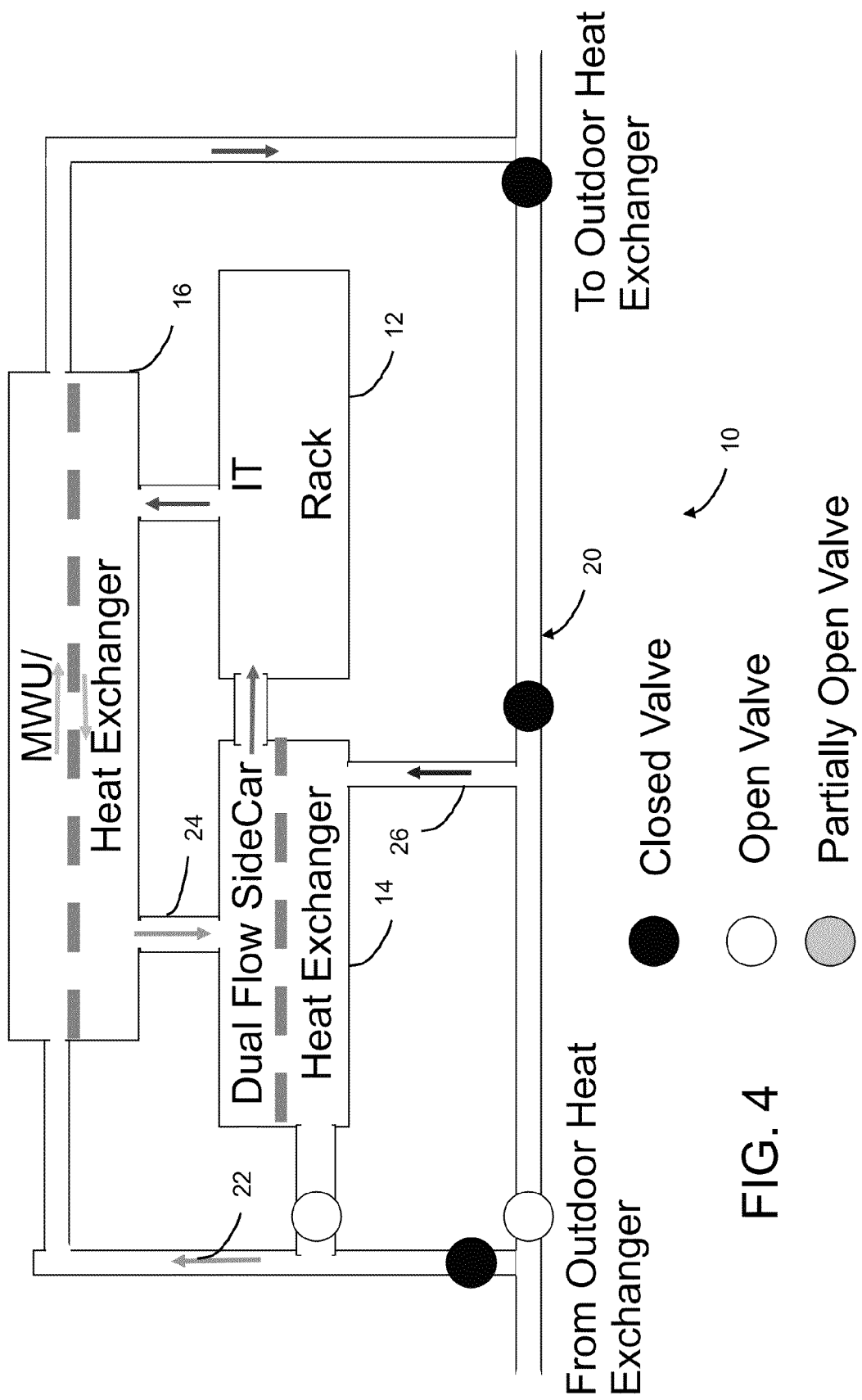
FIG. 4 is a block diagram illustrating another alternate summer dual loop information technology equipment cooling system in accordance with various embodiments.
Figure 5:
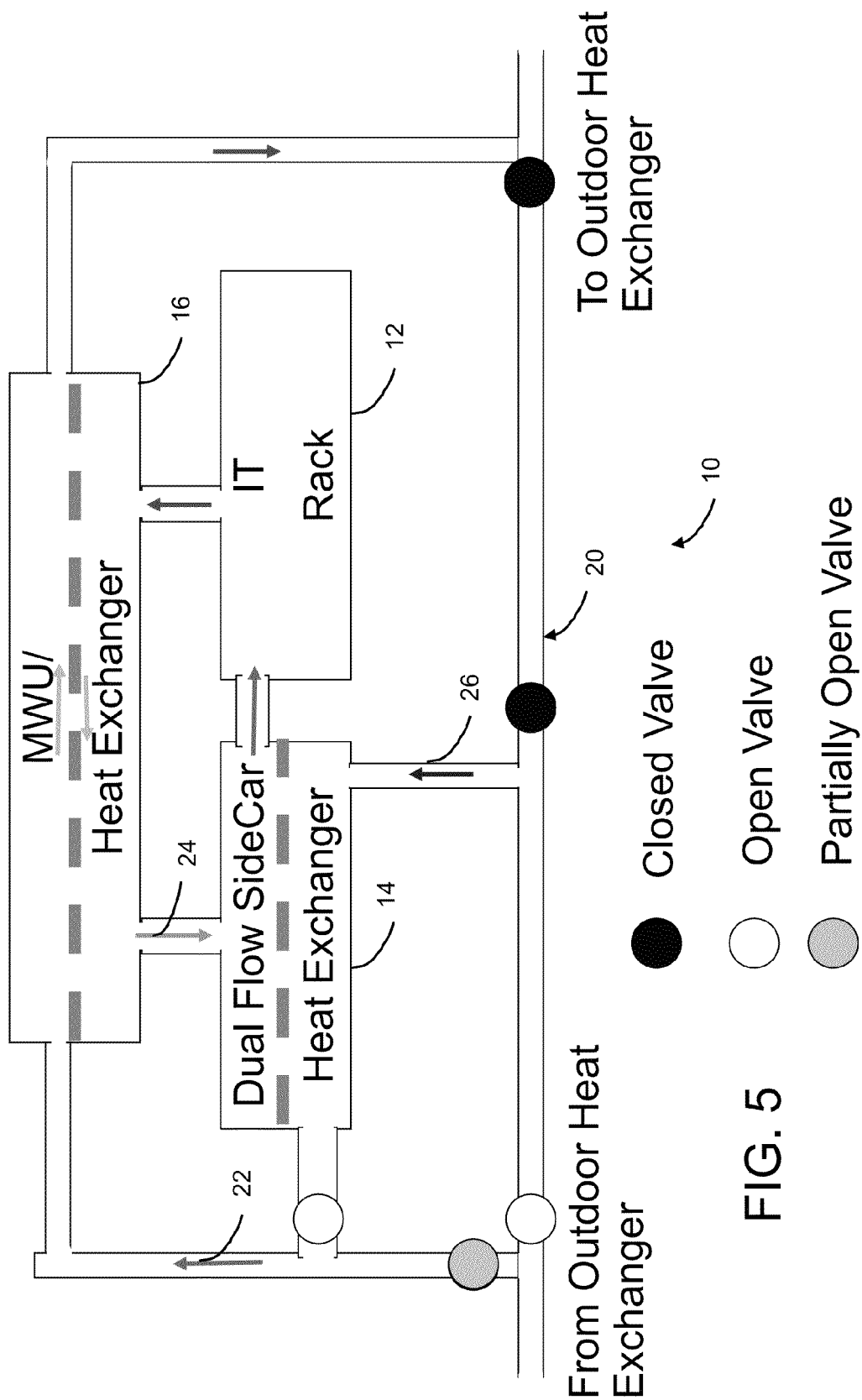
FIG. 5 is a block diagram illustrating an alternate summer dual loop information technology equipment cooling system with exterior bypass in accordance with various embodiments.
Figure 6:
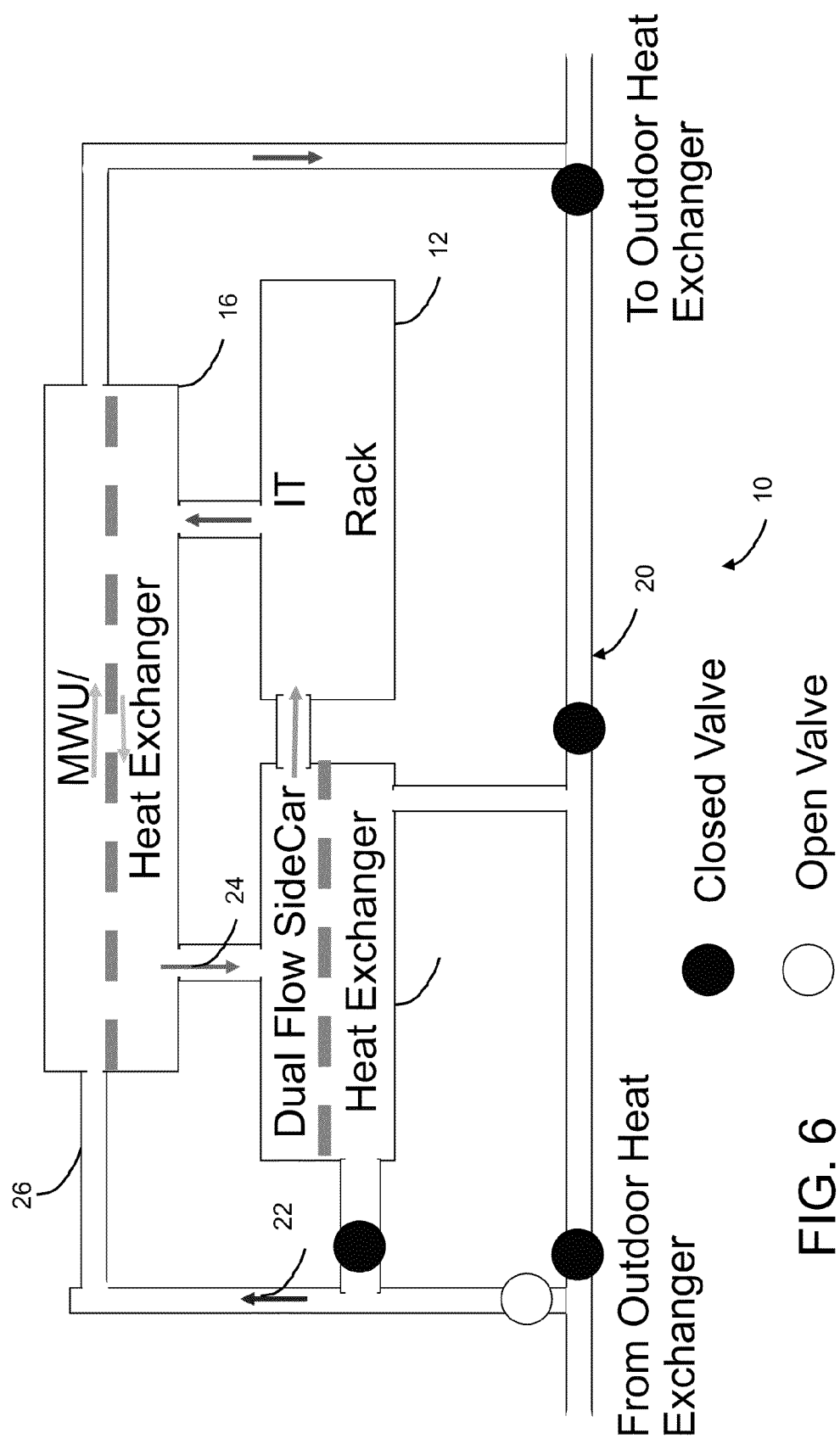
FIG. 6 is a block diagram illustrating a winter dual loop information technology equipment cooling system in accordance with various embodiments.
Figure 7:
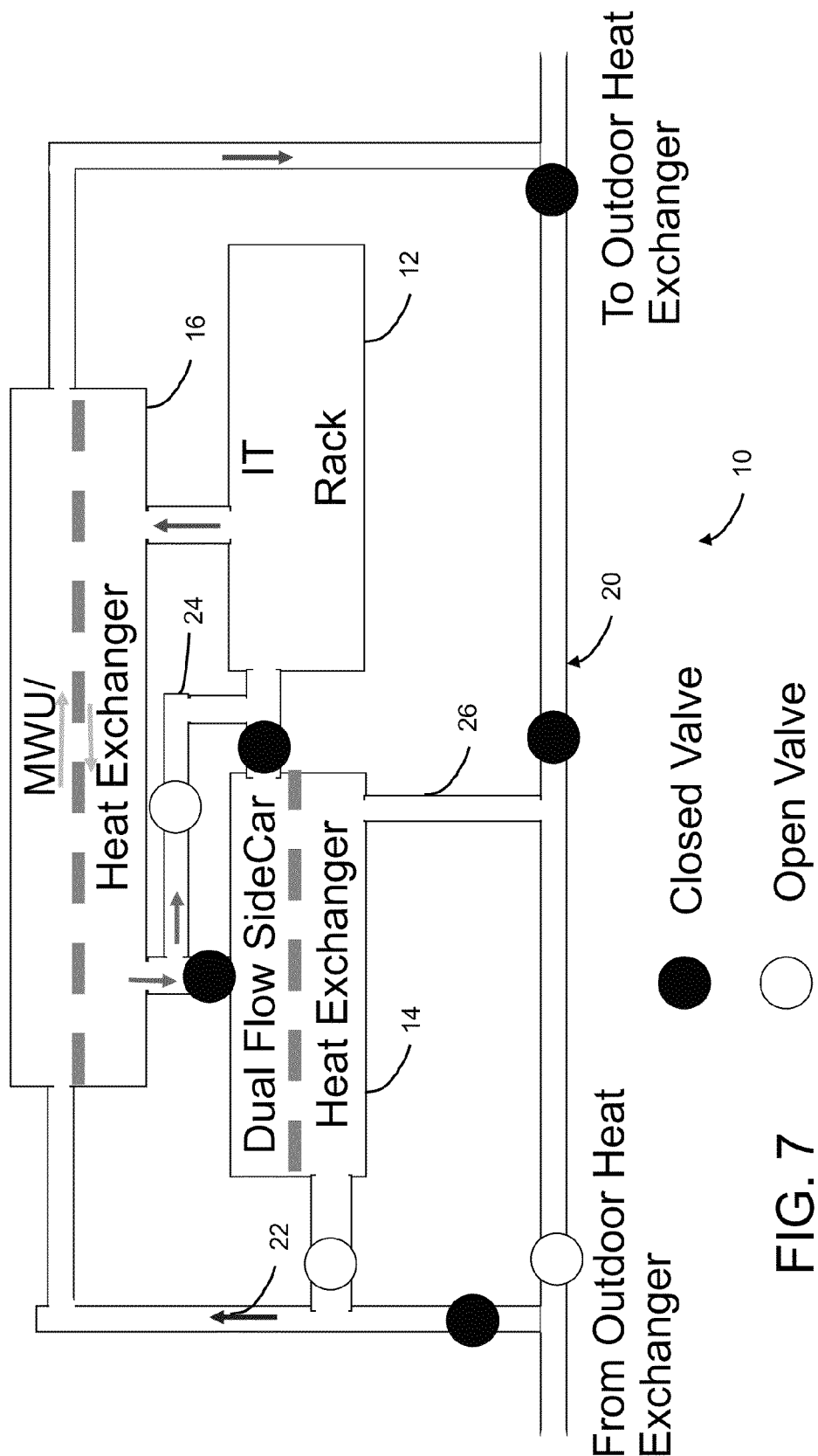
FIG. 7 is a block diagram illustrating another alternate summer dual loop information technology equipment cooling system in accordance with various embodiments.
Figure 8:
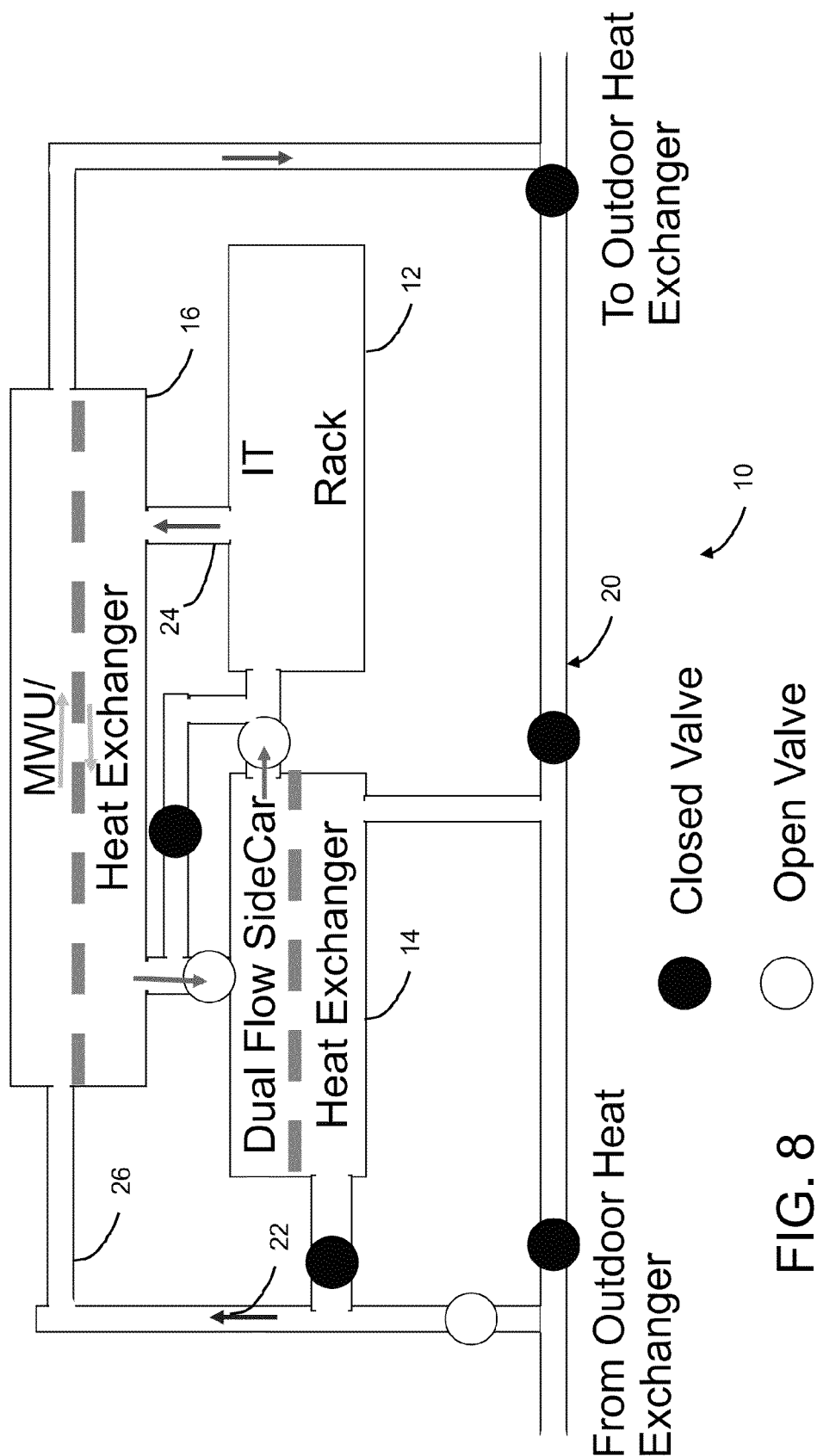
FIG. 8 is a block diagram illustrating an alternate winter dual loop information technology equipment cooling system in accordance with various embodiments.

With reference now to FIG. 1, an example of a system 10 for removing heat from a rack of information technology equipment 12 is initially described. The system 10 includes a sidecar indoor air to liquid heat exchanger 14 that cools warm air generated by the rack of information technology equipment. The sidecar heat exchanger 14 connects to the rack of information technology equipment 12 in any orientation, not just the side. The system 10 also includes a liquid to liquid heat exchanger 16, e.g. a modular water unit (MWU), and an outdoor heat exchanger 18. The system 10 further includes configurable pathways 20 to connect and control fluid flow 22 through the sidecar heat exchanger 14, the liquid to liquid heat exchanger 16, the rack of information technology equipment 12, and the outdoor heat exchanger 18 based upon ambient temperature and/or ambient humidity to remove heat from the rack of information technology equipment.

In one embodiment, the ambient temperature comprises outdoor temperature and/or indoor temperature where indoor refers to within any structure (not shown) housing the rack of information technology equipment 12, and outdoor refers to the space external to such structure that is exposed to the weather. In another embodiment, the ambient humidity comprises outdoor humidity and/or indoor humidity where the terms outdoor and indoor are the same as just previously discussed.

In one embodiment, the ambient temperature and/or the ambient humidity is measured and/or projected. Such measurement represents a value that was actively collected from a suitable measuring instrument whereas a projected value is based upon historical data, statistical data, and/or the like.

In one embodiment, the system 10 additionally includes a first coolant flowing through the sidecar heat exchanger 14 and rack of information technology equipment 12 during a first period of time. For example, the first period of time includes temperatures approaching, or lower than, the freezing point of water and therefore the first coolant includes an anti-freeze additive. In another embodiment, the system 10 also includes a second coolant flowing through the sidecar heat exchanger 14 and outdoor heat exchanger 18 during a second period of time. For instance, the second period of time includes temperatures greater than the freezing point of water and therefore the second coolant is only water.

In one embodiment, either the first coolant or the second coolant is removed from the sidecar heat exchanger 14 using pressurized gas. In other words, the pressurized gas is used to displace the first coolant or the second coolant in the sidecar heat exchanger 14. In another embodiment, compressed air/gas fittings could be added to the sidecar heat exchanger 14 to allow for rapid draining during the coolant switch process. Drained coolant can be either discarded or added back into the loop it originated from.

In one embodiment, the rack of information technology equipment 12 is temporarily opened to use indoor air cooling during an exchange of the second coolant utilized by the sidecar heat exchanger 14 to avoid shutting down the rack of information technology equipment. In another embodiment, the sidecar heat exchanger 14 is positioned upstream and/or downstream of the liquid to liquid heat exchanger 16.

In one embodiment, the system 10 also includes an interior loop 24 passing through the sidecar heat exchanger 14 and the liquid to liquid heat exchanger 16 and/or the rack of information technology equipment 12. In another embodiment, the system 10 further includes an exterior loop 26 passing through the sidecar heat exchanger 14 and the outdoor heat exchanger 18. In another embodiment, the exterior loop 26 coolant, e.g. glycol solution, (and the exterior loop contaminants) are kept from entering the more sensitive (relative to the sidecar heat exchanger 14) rack of information technology equipment 12.

In one embodiment, the fluid flow within the interior loop 24 and the exterior loop 26 are separate from each other. In another embodiment, the system 10 additionally includes bypass flow in the exterior loop 26. For example, the bypass flow is used to limit pressure drop across the sidecar heat exchanger 14 and to adjust the liquid to liquid heat exchanger's 16 inlet temperature. In another embodiment, the bypass flow is used in the interior loop 24 and/or the exterior loop 26. For example, the summer function could involve little or no flow through the interior loop 24 of the dual path sidecar heat exchanger 14. Stated another way, the liquid to liquid heat exchanger 16 provides most or all of the fluid flow to the rack of information technology equipment.

In one embodiment, the sidecar heat exchanger 14 includes two separate sidecar heat exchangers with one of the two sidecar heat exchangers connected to the interior loop 24 and the other sidecar heat exchanger connected to the exterior loop 26. In another embodiment, the fluid flow is controlled to flow through the interior loop 24 and/or exterior loop 26. For instance, the configurable pathways 20 route the fluid flow within the interior loop 24 and/or exterior loop 26.

In one embodiment, the system 10 also includes a single set of heat transfer fins used for the interior loop 24 and the exterior loop 26 within the sidecar heat exchanger 14. For example, such a dual path sidecar heat exchanger 14 can be used for cost reasons and/or for support of the liquid to liquid heat exchanger 14 function.

In one embodiment, the sidecar heat exchanger's 14 interior loop 24 is positioned upstream and/or downstream of the rack of information technology equipment 12.

In another example embodiment, the system 10 for removing heat from a rack of information technology equipment 12 includes a liquid to liquid heat exchanger 16 and an outdoor heat exchanger 18. The system 10 also includes a sidecar indoor air to liquid heat exchanger 14 that cools warm air generated by the rack of information technology equipment 12, and the sidecar heat exchanger is positioned upstream and/or downstream of the liquid to liquid heat exchanger 16. The system 10 further includes configurable pathways 20 to connect and control fluid flow 22 through the sidecar heat exchanger 14, the liquid to liquid heat exchanger 16, the rack of information technology equipment 12, and the outdoor heat exchanger 18 based upon ambient temperature and/or ambient humidity to remove heat from the rack of information technology equipment. The system 10 additionally includes a first coolant flowing through the sidecar heat exchanger 14 and rack of information technology equipment 12 during a first period of time, and a second coolant flowing through the sidecar heat exchanger and outdoor heat exchanger 18 during a second period of time.

In another example embodiment, the system 10 for removing heat from a rack of information technology equipment 12 includes a liquid to liquid heat exchanger 16 and an outdoor heat exchanger 18. The system 10 also includes a sidecar indoor air to liquid heat exchanger 14 that cools warm air generated by the rack of information technology equipment 12, and the sidecar heat exchanger is positioned upstream and/or downstream of the liquid to liquid heat exchanger 16. The system 10 further includes configurable pathways 20 to connect and control fluid flow 22 through the sidecar heat exchanger 14, the liquid to liquid heat exchanger 16, the rack of information technology equipment 12, and the outdoor heat exchanger 18 based upon ambient temperature and/or ambient humidity to remove heat from the rack of information technology equipment. The system 10 additionally includes an interior loop 24 passing through the sidecar heat exchanger 14 and the liquid to liquid heat exchanger 16 and/or the rack of information technology equipment 12. The system 10 also includes an exterior loop 26 passing through the sidecar heat exchanger 14 and the outdoor heat exchanger 18 where the fluid flow 22 within the interior loop 24 and the exterior loop are separate from each other.

Figure 9:
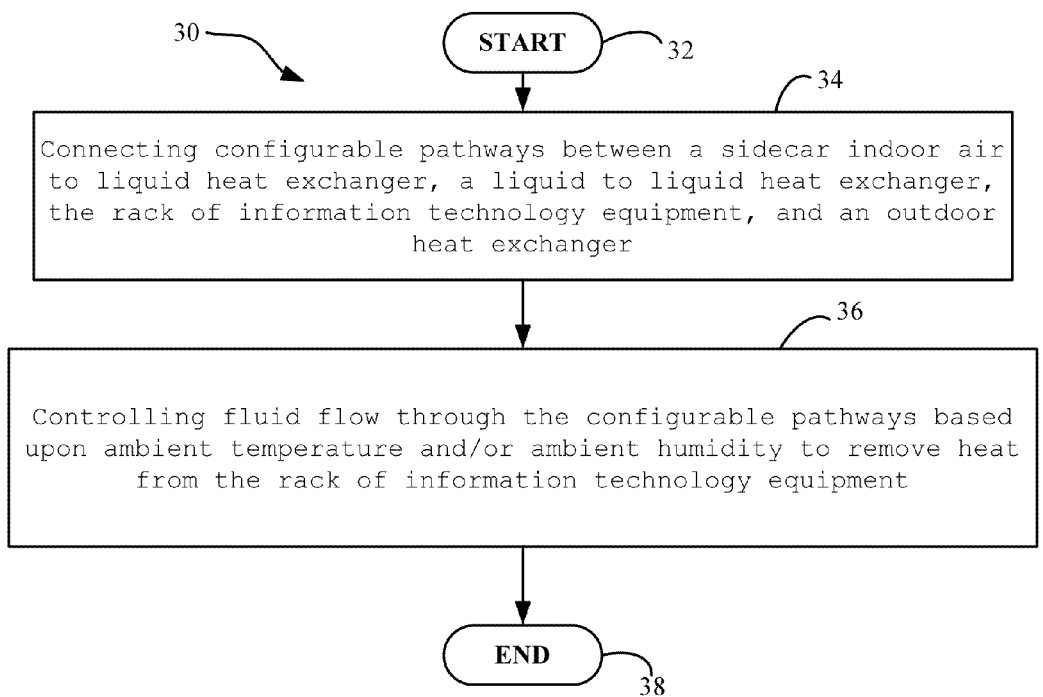
FIG. 9 is a flowchart illustrating method aspects according to various embodiments.

Another aspect is a method to remove heat from a rack of information technology equipment, which is now described with reference to flowchart 30 of FIG. 9. The method begins at Block 32 and may include connecting configurable pathways between a sidecar indoor air to liquid heat exchanger, a liquid to liquid heat exchanger, the rack of information technology equipment, and an outdoor heat exchanger at Block 34. The method may also include controlling fluid flow through the configurable pathways based upon ambient temperature and/or ambient humidity to remove heat from the rack of information technology equipment at Block 36. The method ends at Block 38.

Figure 10:
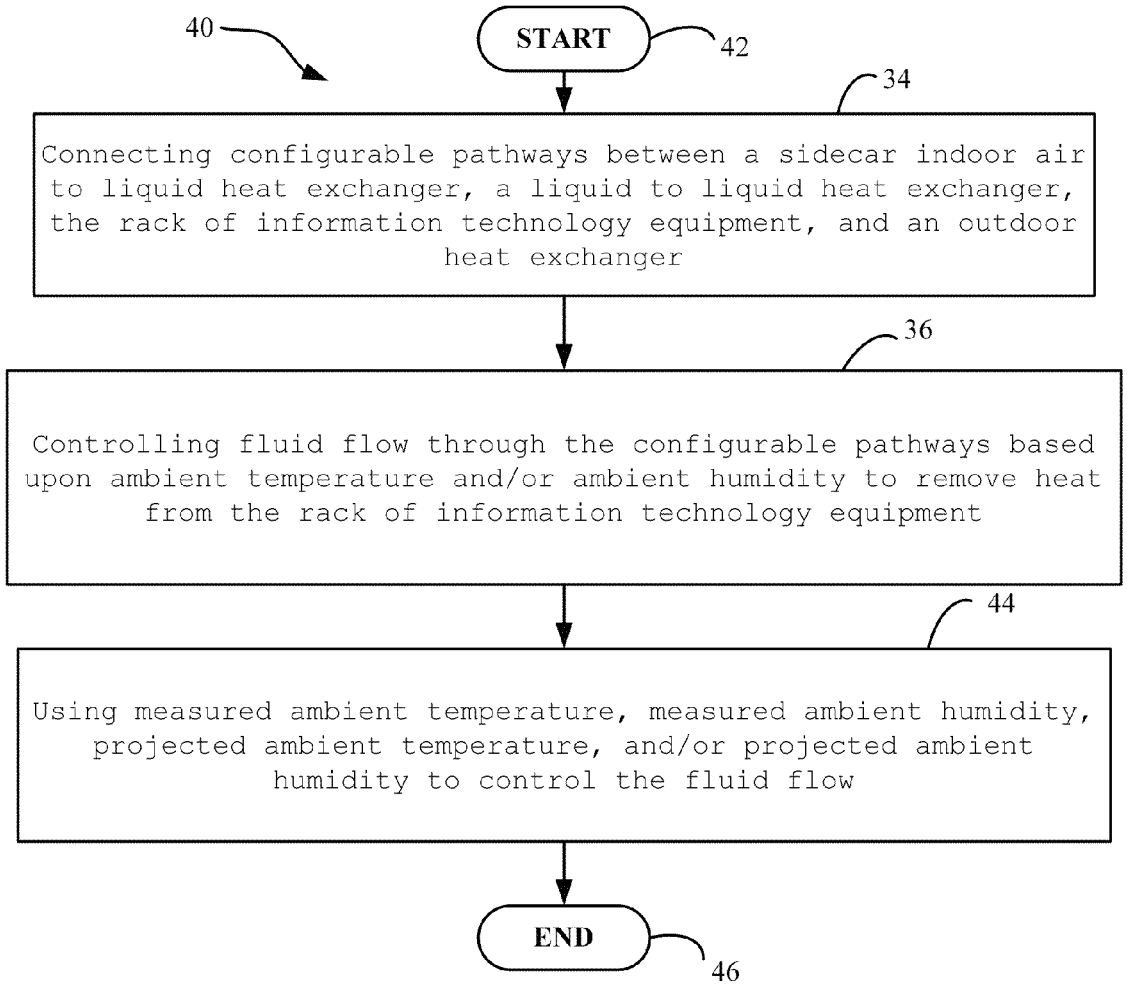
FIG. 10 is a flowchart illustrating method aspects according to the method of FIG. 9.

In another method embodiment, which is now described with reference to flowchart 40 of FIG. 10, the method begins at Block 42. The method may include the steps of FIG. 9 at Blocks 34 and 36. The method may also include using measured ambient temperature, measured ambient humidity, projected ambient temperature, and/or projected ambient humidity to control the fluid flow at Block 44. The method ends at Block 46.

Figure 11:
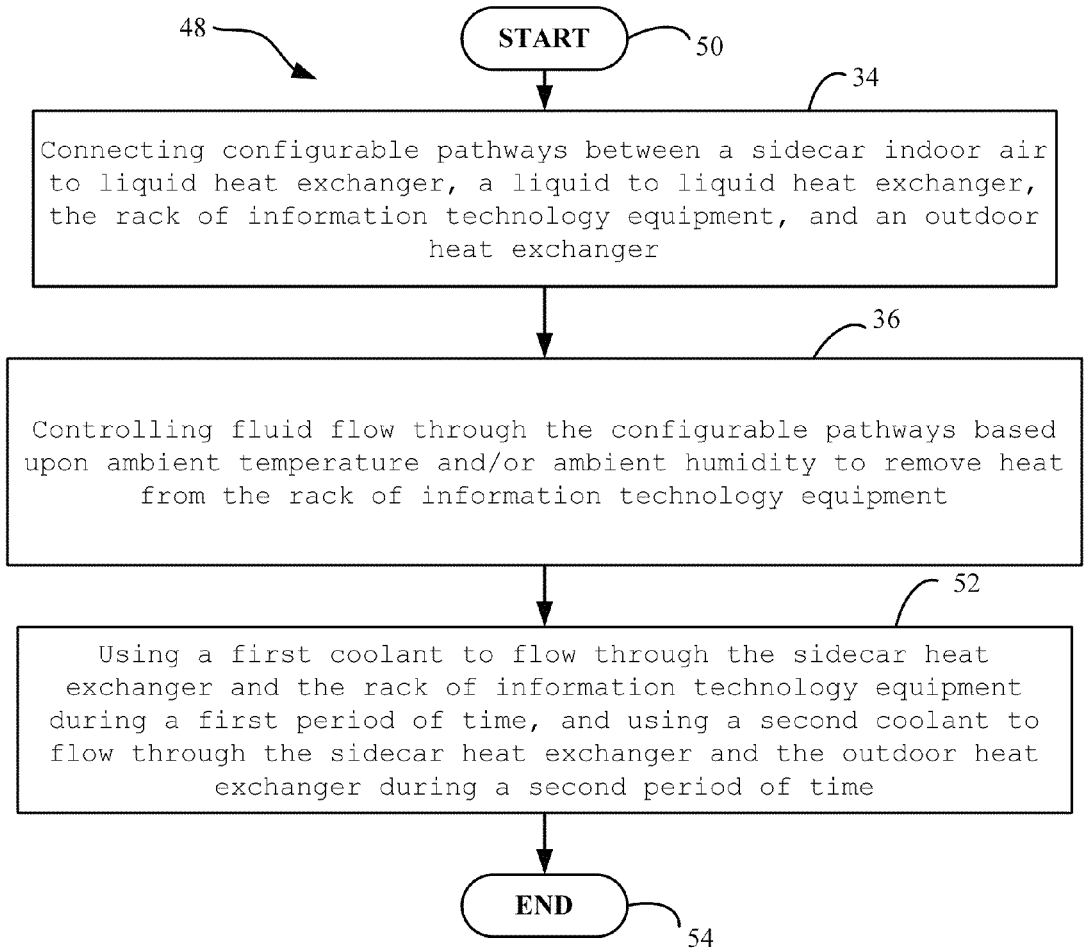
FIG. 11 is a flowchart illustrating method aspects according to the method of FIG. 9.

In another method embodiment, which is now described with reference to flowchart 48 of FIG. 11, the method begins at Block 50. The method may include the steps of FIG. 9 at Blocks 34 and 36. The method may also include using a first coolant to flow through the sidecar heat exchanger and the rack of information technology equipment during a first period of time, and using a second coolant to flow through the sidecar heat exchanger and the outdoor heat exchanger during a second period of time at Block 52. The method ends at Block 54.

Figure 12:
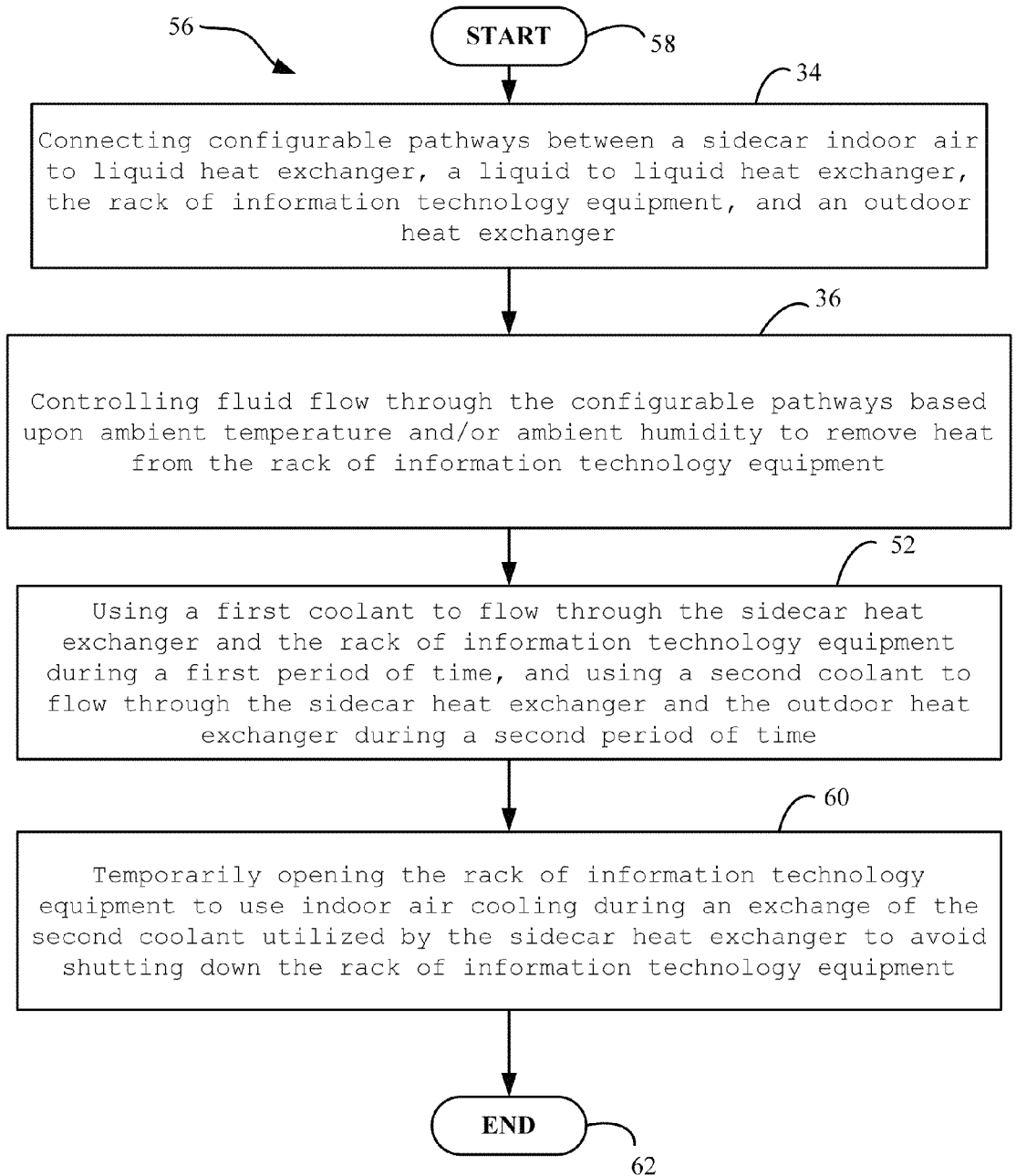
FIG. 12 is a flowchart illustrating method aspects according to the method of FIG. 11.

In another method embodiment, which is now described with reference to flowchart 56 of FIG. 12, the method begins at Block 58. The method may include the steps of FIG. 11 at Blocks 34, 36, and 52. The method may also include temporarily opening the rack of information technology equipment to use indoor air cooling during an exchange of the second coolant utilized by the sidecar heat exchanger to avoid shutting down the rack of information technology equipment at Block 60. The method ends at Block 62.

Figure 13:
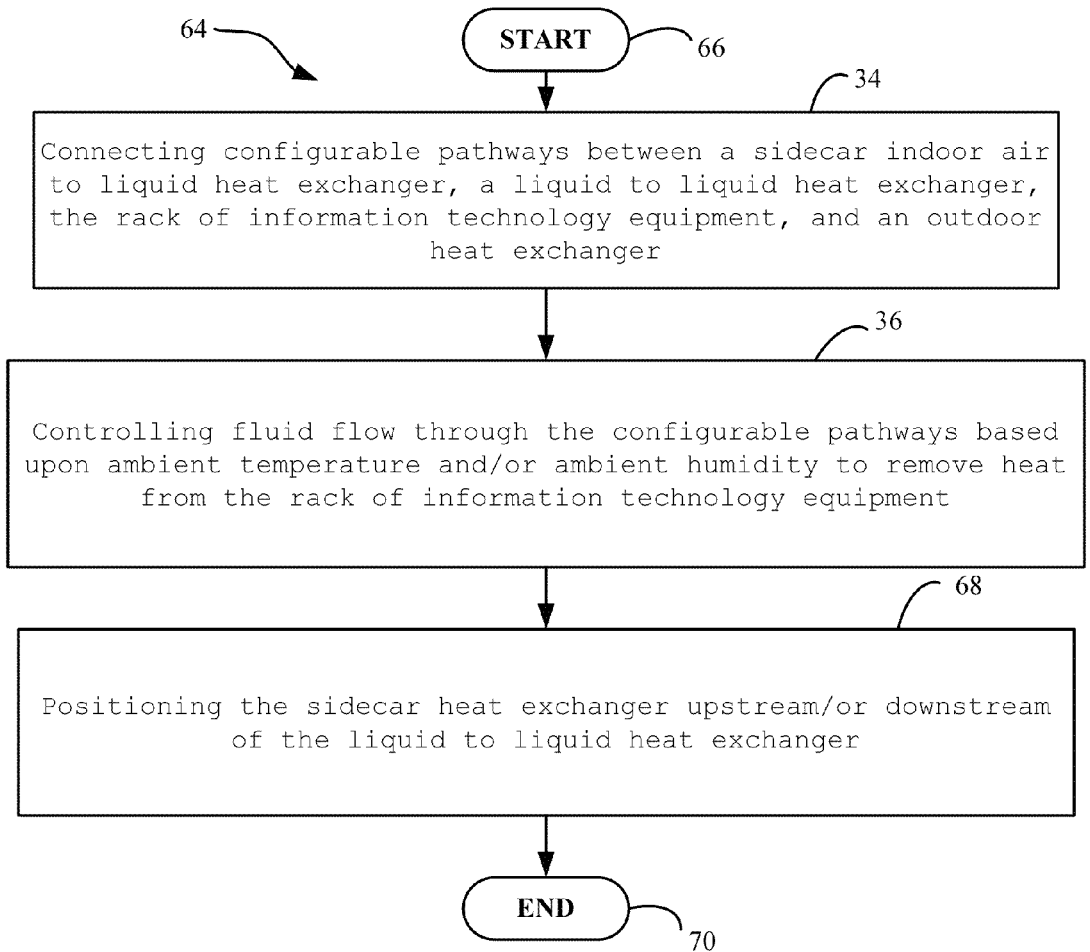
FIG. 13 is a flowchart illustrating method aspects according to the method of FIG. 9.

In another method embodiment, which is now described with reference to flowchart 64 of FIG. 13, the method begins at Block 66. The method may include the steps of FIG. 9 at Blocks 34 and 36. The method may also includes positioning the sidecar heat exchanger upstream/or downstream of the liquid to liquid heat exchanger at Block 68. The method ends at Block 70.

Figure 14:
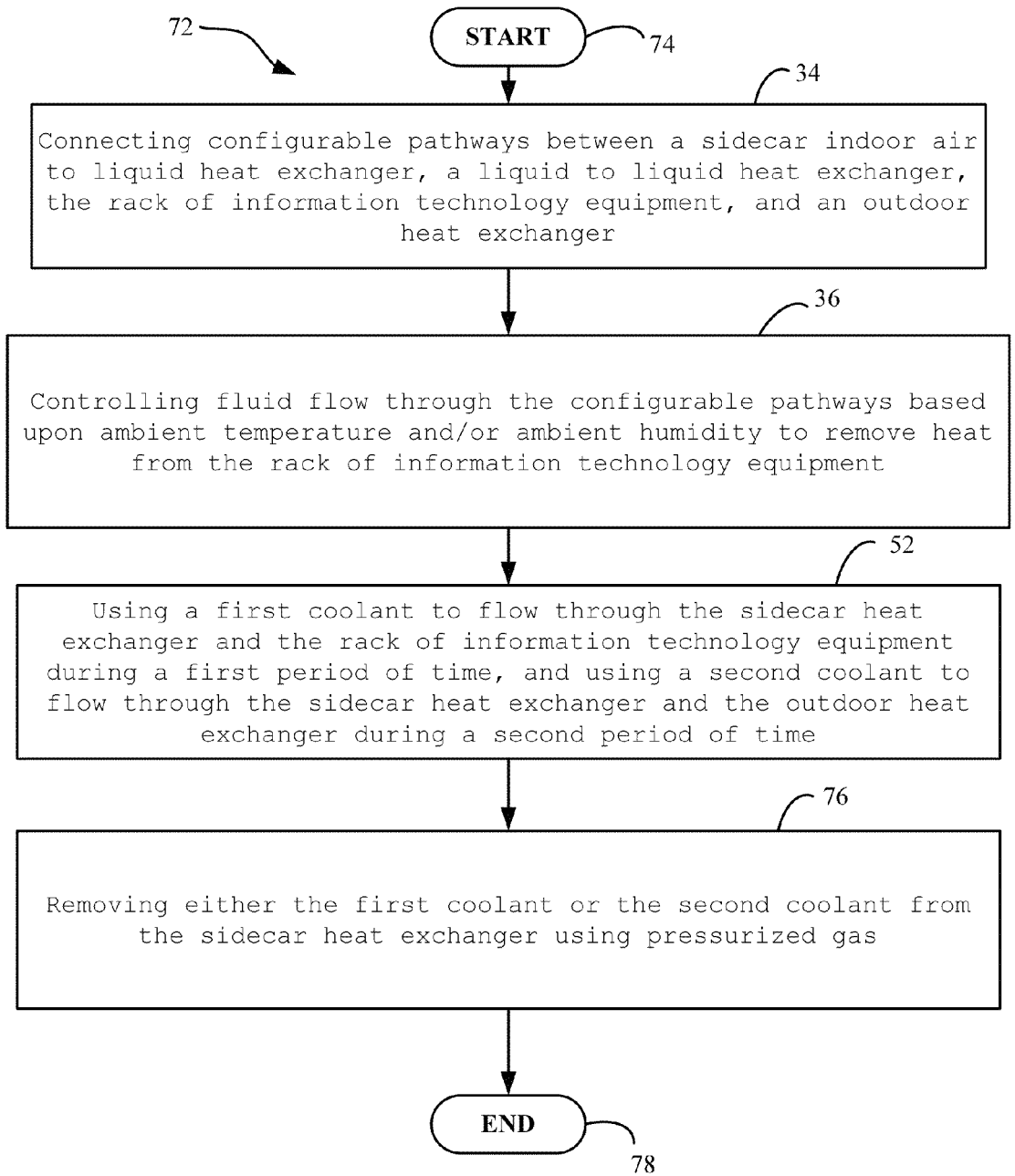
FIG. 14 is a flowchart illustrating method aspects according to the method of FIG. 11.

In another method embodiment, which is now described with reference to flowchart 72 of FIG. 14, the method begins at Block 74. The method may include the steps of FIG. 11 at Blocks 34, 36, and 52. The method may also include removing either the first coolant or the second coolant from the sidecar heat exchanger using pressurized gas at Block 76. The method ends at Block 78.

Figure 15:
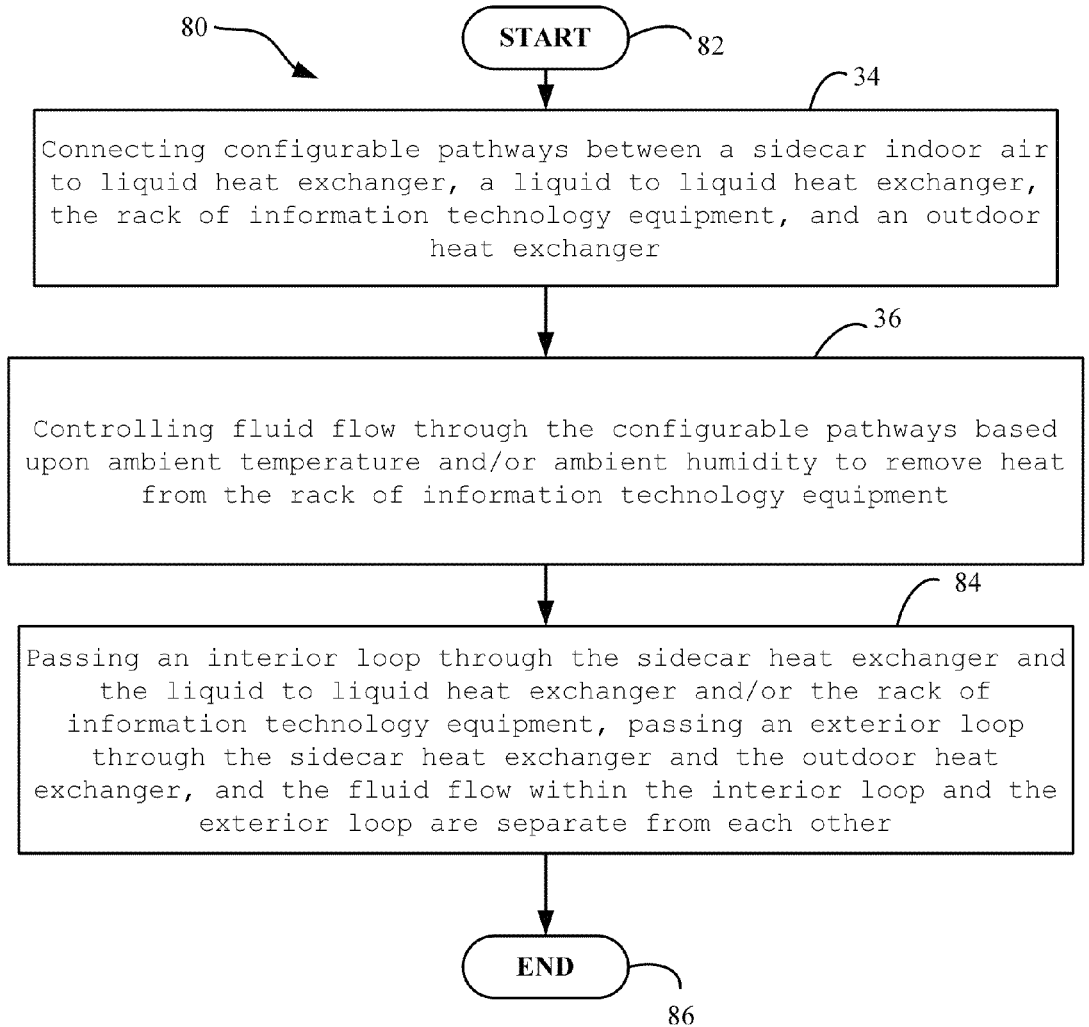
FIG. 15 is a flowchart illustrating method aspects according to the method of FIG. 9.

In another method embodiment, which is now described with reference to flowchart 80 of FIG. 15, the method begins at Block 82. The method may include the steps of FIG. 9 at Blocks 34 and 36. The method may also include passing an interior loop through the sidecar heat exchanger and the liquid to liquid heat exchanger and/or the rack of information technology equipment, passing an exterior loop through the sidecar heat exchanger and the outdoor heat exchanger, and the fluid flow within the interior loop and the exterior loop are separate from each other at Block 84. The method ends at Block 86.

Figure 16:
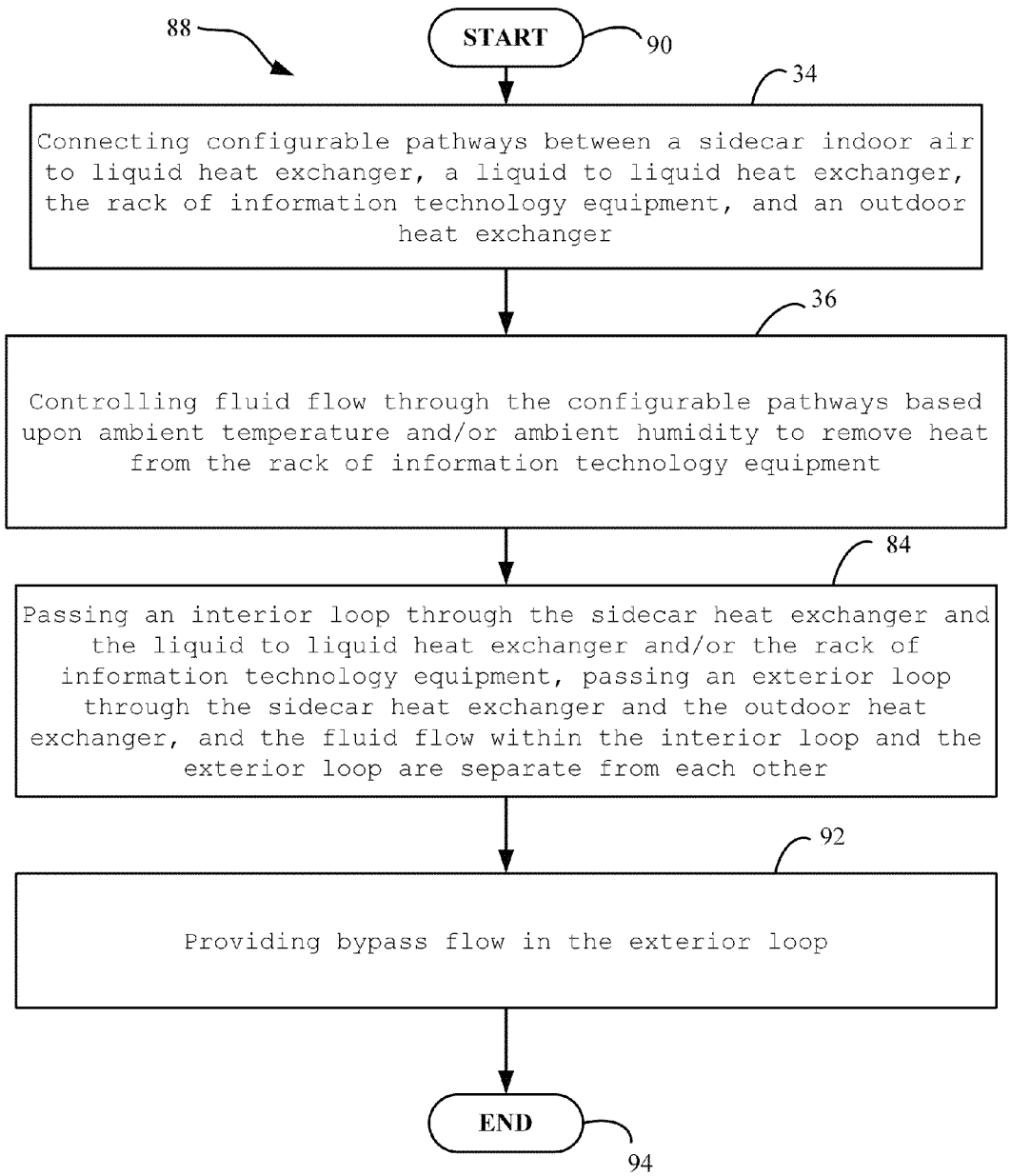
FIG. 16 is a flowchart illustrating method aspects according to the method of FIG. 15.

In another method embodiment, which is now described with reference to flowchart 88 of FIG. 16, the method begins at Block 90. The method may include the steps of FIG. 15 at Blocks 34, 36, and 84. The method may also include providing bypass flow in the exterior loop at Block 92. The method ends at Block 94.

Figure 17:
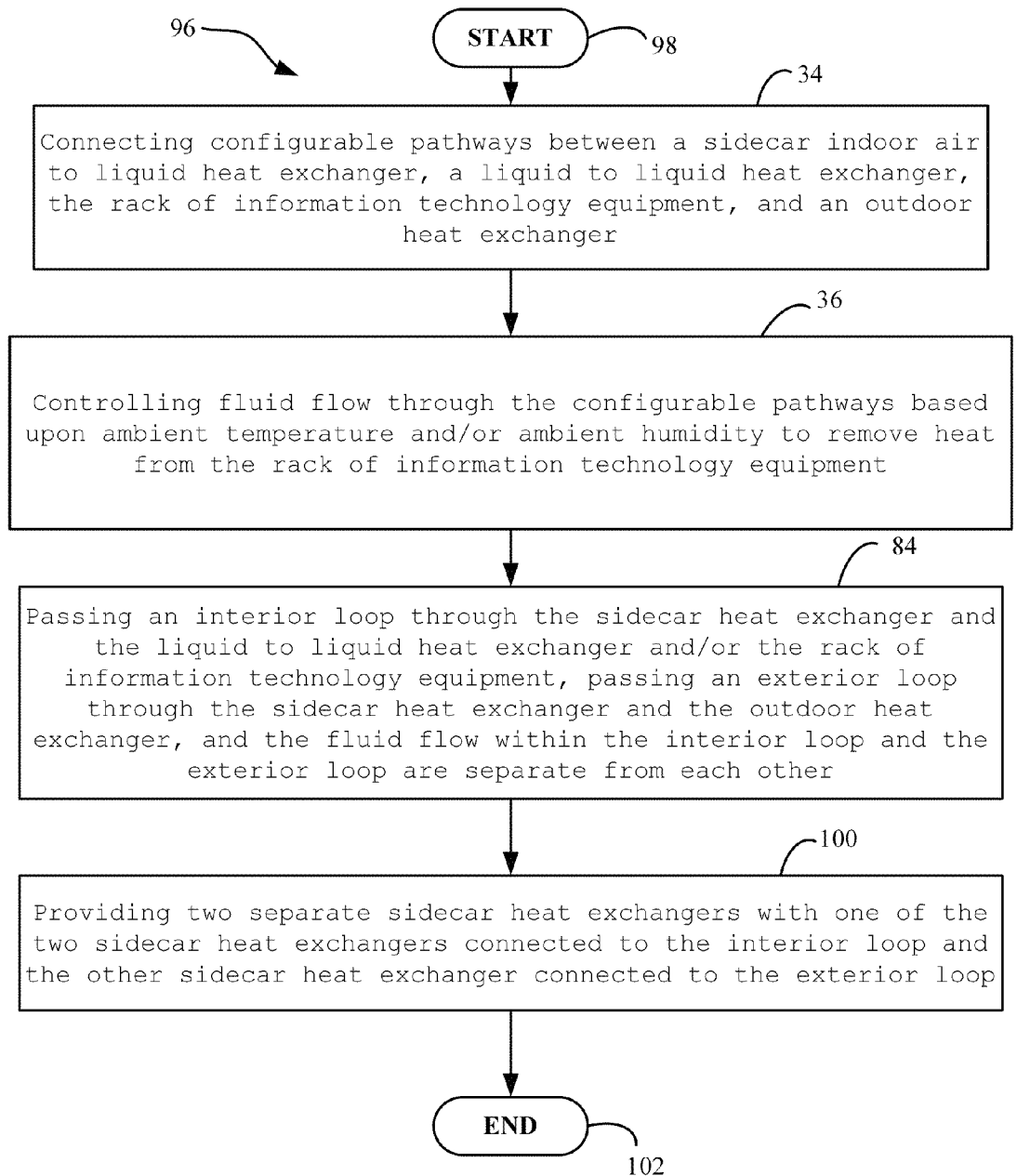
FIG. 17 is a flowchart illustrating method aspects according to the method of FIG. 15.

In another method embodiment, which is now described with reference to flowchart 96 of FIG. 17, the method begins at Block 98. The method may include the steps of FIG. 15 at Blocks 34, 36, and 84. The method may also include providing two separate sidecar heat exchangers with one of the two sidecar heat exchangers connected to the interior loop and the other sidecar heat exchanger connected to the exterior loop at Block 100. The method ends at Block 102.

Figure 18:
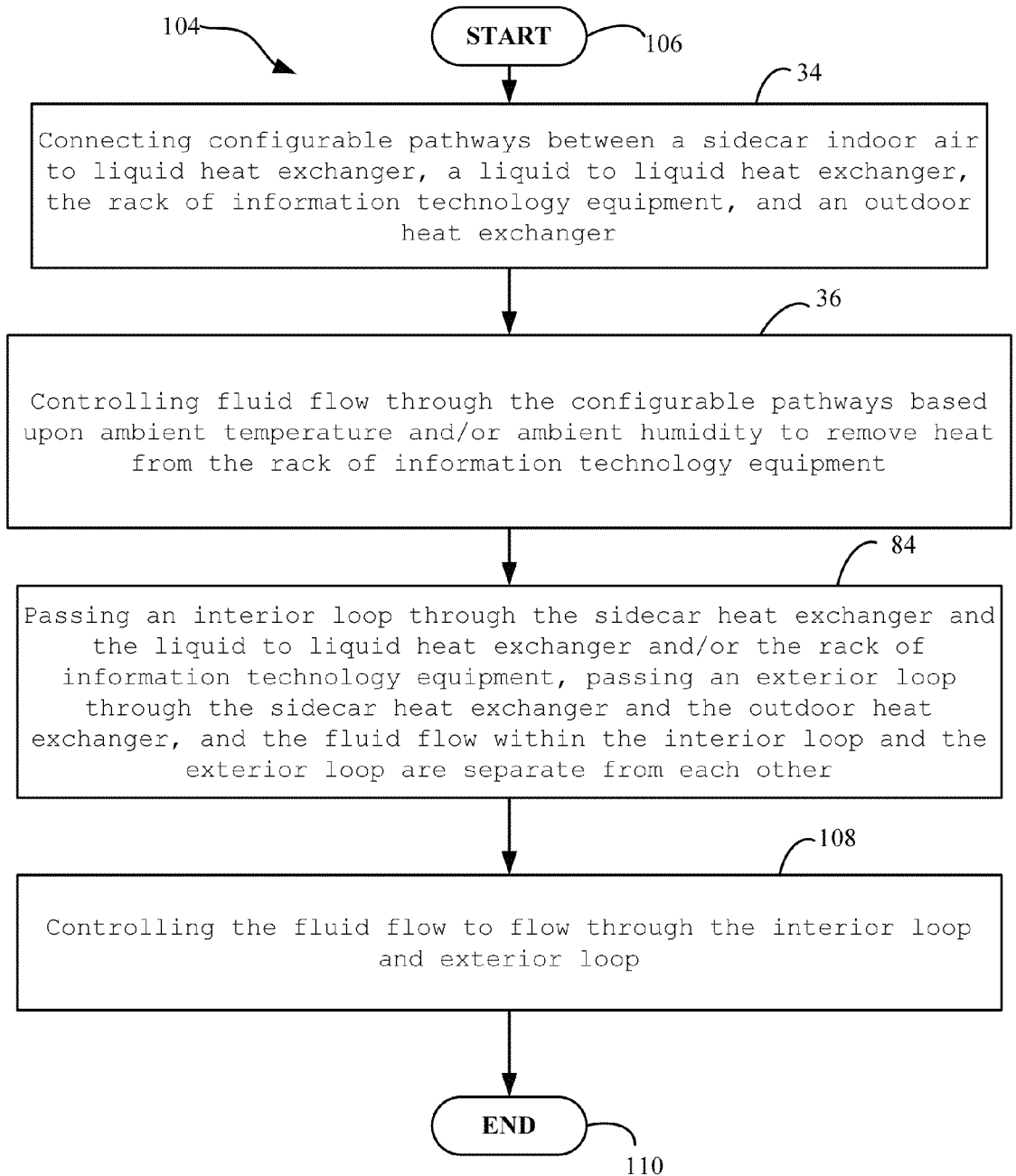
FIG. 18 is a flowchart illustrating method aspects according to the method of FIG. 15.

In another method embodiment, which is now described with reference to flowchart 104 of FIG. 18, the method begins at Block 106. The method may include the steps of FIG. 15 at Blocks 34, 36, and 84. The method may also include controlling the fluid flow to flow through the interior loop and exterior loop at Block 108. The method ends at Block 110.

Figure 19:
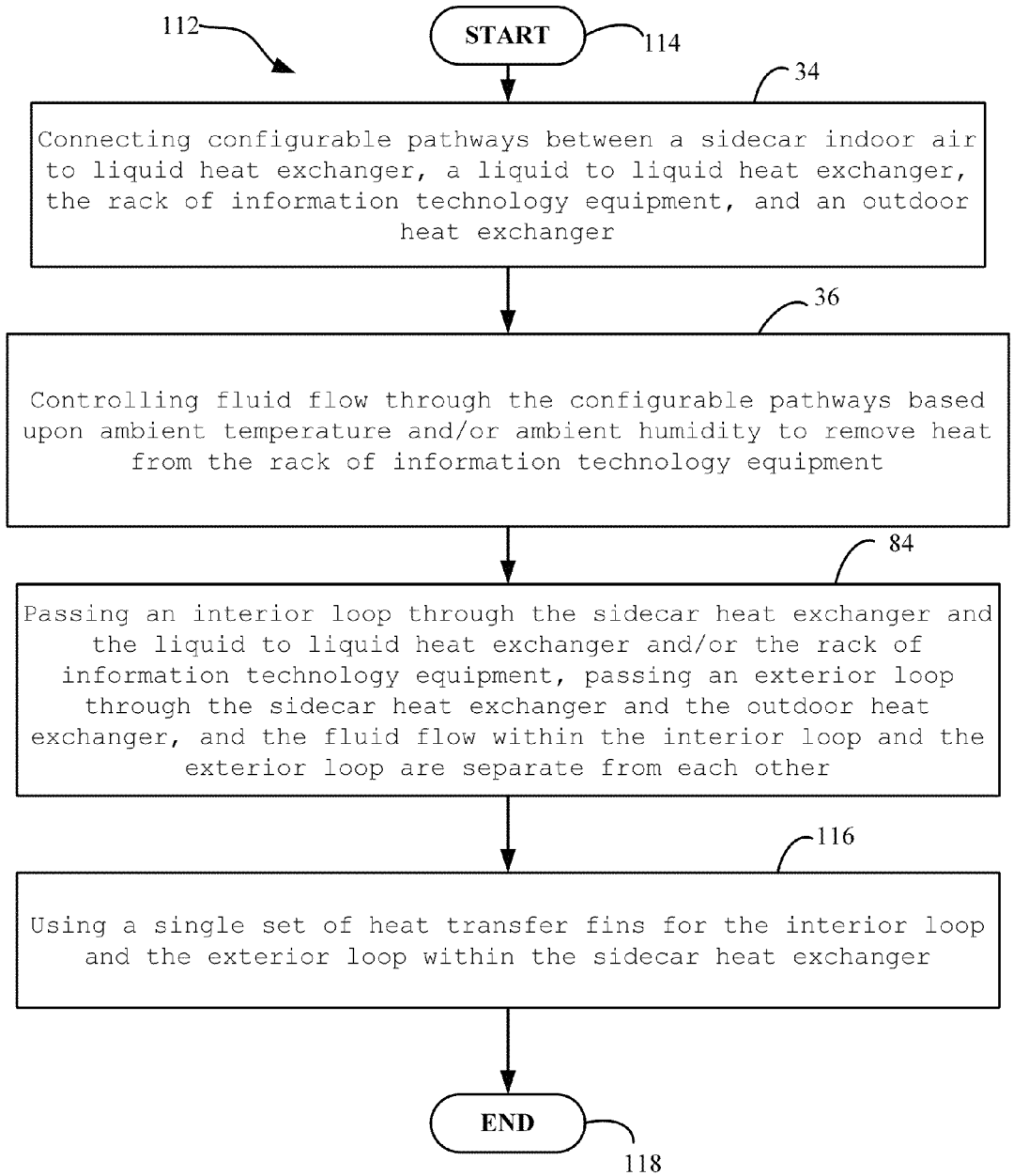
FIG. 19 is a flowchart illustrating method aspects according to the method of FIG. 15.

In another method embodiment, which is now described with reference to flowchart 112 of FIG. 19, the method begins at Block 114. The method may include the steps of FIG. 15 at Blocks 34, 36, and 84. The method may also include using a single set of heat transfer fins for the interior loop and the exterior loop within the sidecar heat exchanger at Block 116. The method ends at Block 118.

Figure 20:
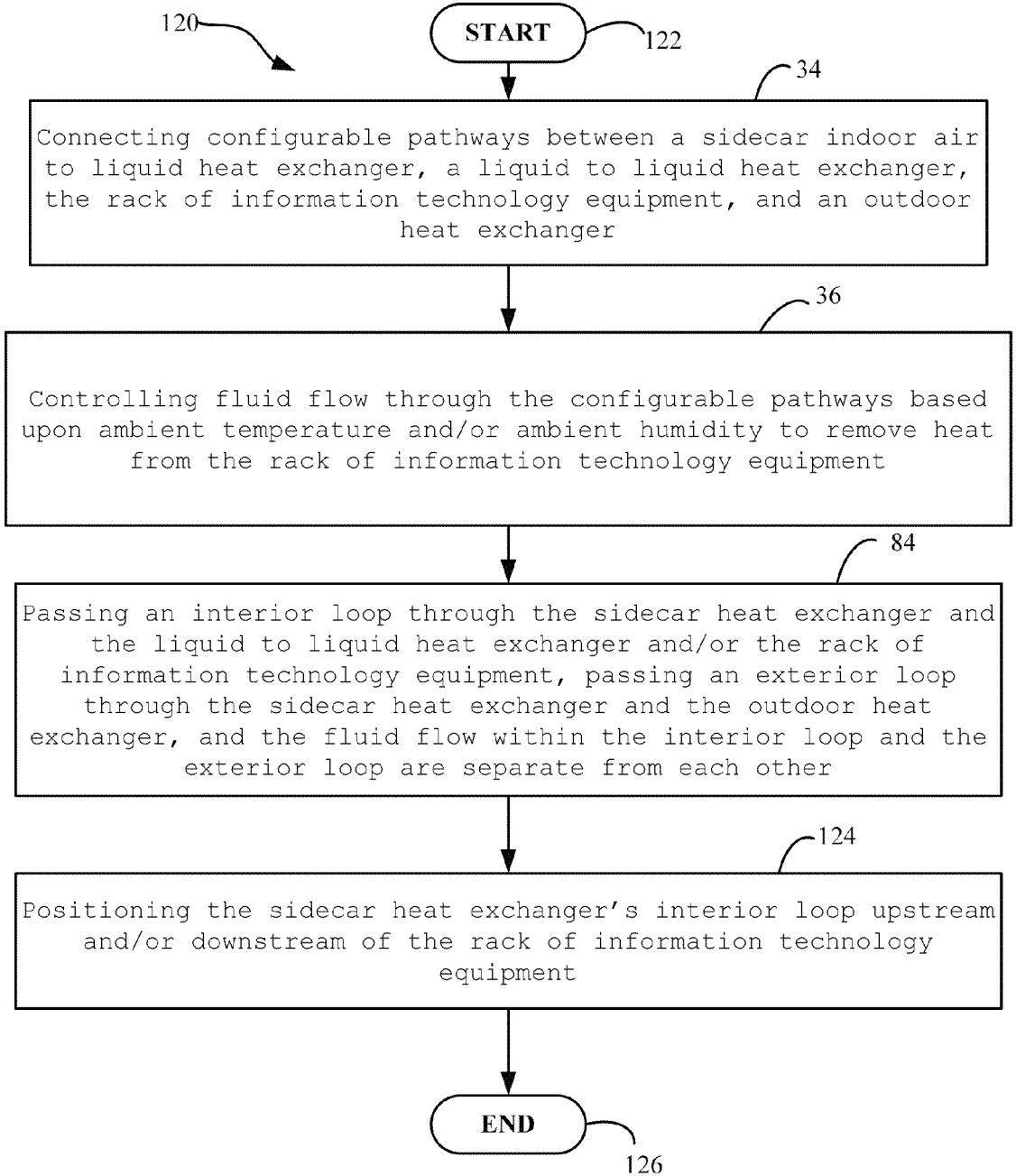
FIG. 20 is a flowchart illustrating method aspects according to the method of FIG. 15.

In another method embodiment, which is now described with reference to flowchart 120 of FIG. 20, the method begins at Block 122. The method may include the steps of FIG. 15 at Blocks 34, 36, and 84. The method may also include positioning the sidecar heat exchanger's interior loop upstream and/or downstream of the rack of information technology equipment at Block 124. The method ends at Block 126.

Figure 21:
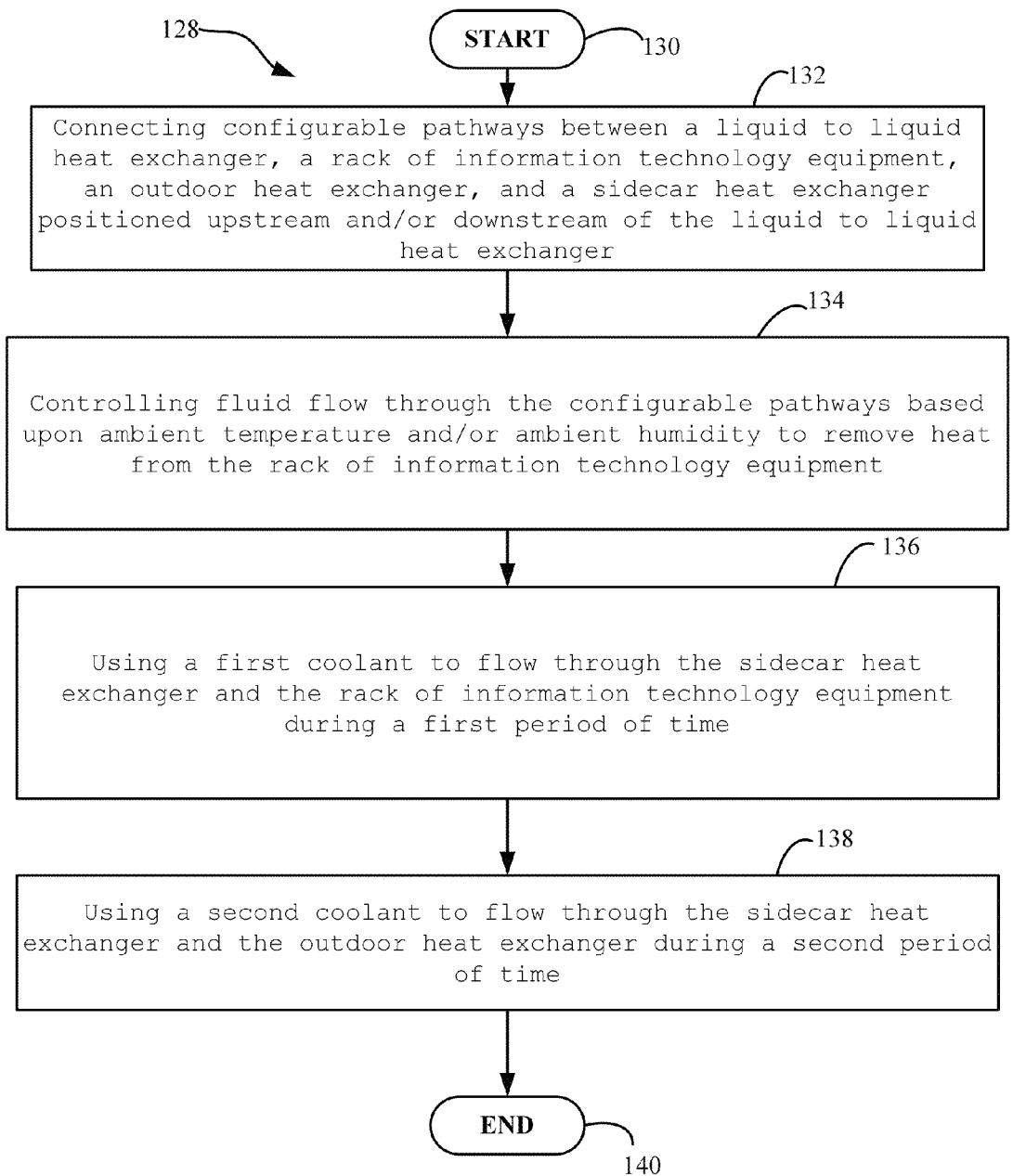
FIG. 21 is a flowchart illustrating method aspects according to various embodiments.

In another method embodiment, which is now described with reference to flowchart 128 of FIG. 21, the method begins at Block 130. The method may include connecting configurable pathways between a liquid to liquid heat exchanger, a rack of information technology equipment, an outdoor heat exchanger, and a sidecar heat exchanger positioned upstream and/or downstream of the liquid to liquid heat exchanger at Block 132. The method may also include controlling fluid flow through the configurable pathways based upon ambient temperature and/or ambient humidity to remove heat from the rack of information technology equipment at Block 134. The method may further include using a first coolant to flow through the sidecar heat exchanger and the rack of information technology equipment during a first period of time at Block 136. The method may additionally include using a second coolant to flow through the sidecar heat exchanger and the outdoor heat exchanger during a second period of time at Block 138. The method ends at Block 140.

Figure 22:
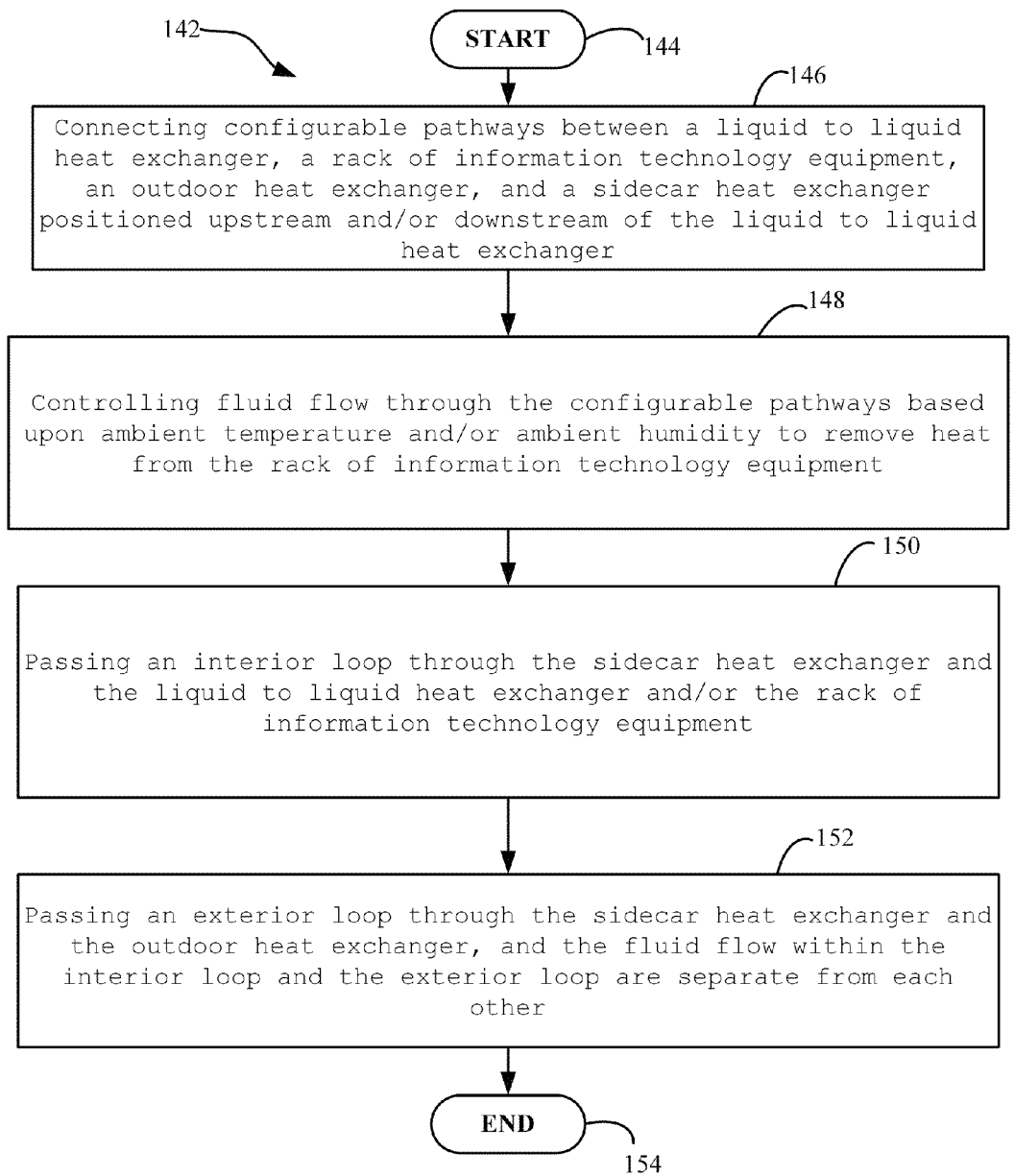
FIG. 22 is a flowchart illustrating method aspects according to various embodiments.

In another method embodiment, which is now described with reference to flowchart 142 of FIG. 22, the method begins at Block 144. The method may include connecting configurable pathways between a liquid to liquid heat exchanger, a rack of information technology equipment, an outdoor heat exchanger, and a sidecar heat exchanger positioned upstream and/or downstream of the liquid to liquid heat exchanger at Block 146. The method may also include controlling fluid flow through the configurable pathways based upon ambient temperature and/or ambient humidity to remove heat from the rack of information technology equipment at Block 148. The method may further include passing an interior loop through the sidecar heat exchanger and the liquid to liquid heat exchanger and/or the rack of information technology equipment at Block 150. The method may additionally include passing an exterior loop through the sidecar heat exchanger and the outdoor heat exchanger, and the fluid flow within the interior loop and the exterior loop are separate from each other at Block 152. The method ends at Block 154.

In view of the foregoing, the system 10 provides heat removal from a rack of information technology equipment 12. For example, a dual enclosure liquid cooled (DELC) system utilizing a dual loop (DLDELC) [typically without coolant switching] sacrifices thermal performance in the summer for freeze and condensation protection in the winter. This is a particular issue where the interior "air side" peak temperature is the limiting factor during hot weather. The substantial temperature rise across the liquid/liquid heat exchanger (MWU) is a significant constraint on peak ambient temperature and results in increased power use versus a water based single loop.

In an embodiment, system 10 routes exterior loop's 26 coolant to the sidecar indoor air to liquid heat exchanger 14 for the hot weather period, either upstream or downstream of the liquid to liquid heat exchanger 16. In another embodiment, the foregoing system 10 uses draining and refilling of the sidecar heat exchanger 14 in the spring and the fall.

In an embodiment, system 10 uses a dual (separate) liquid loop sidecar heat exchanger 14 with valves to control whether interior, exterior, or both liquid loops 24 and 26 are routed through the sidecar heat exchanger based upon on the ambient temperature and humidity conditions. In another embodiment, the sidecar heat exchanger's 14 exterior loop 26 is placed upstream or downstream of the liquid to liquid heat exchanger 16. In another embodiment, the sidecar heat exchanger's 14 interior loop 24 is placed upstream or downstream of the rack of information technology equipment 12.

In one embodiment, any valve shown as fully closed in the figures may in operation be very slightly opened to avoid stagnation of "trapped" coolant. Alternatively, the coolant loop 24 and 26 located between two closed valves can be drained as the volume of coolant is not particularly large. In another embodiment, when switching from one valve configuration to another in the dual loop approach, the new majority coolant loop would first be opened, then the old coolant loop closed.

As will be appreciated by one skilled in the art, aspects may be embodied as a system and/or method. Aspects of the embodiments are described above with reference to flowchart illustrations and/or block diagrams of methods and apparatus (systems).

The flowchart and block diagrams in the figures illustrate the architecture, functionality, and operation of possible implementations of systems and methods according to various embodiments. It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved.

The terminology used herein is for the purpose of describing particular embodiments only and is not intended to be limiting. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements in the claims below are intended to include any structure, material, or act for performing the function in combination with other claimed elements as specifically claimed. The description of the embodiments has been presented for purposes of illustration and description, but is not intended to be exhaustive or limited to the embodiments in the form disclosed. Many modifications and variations will be apparent to those of ordinary skill in the art without departing from the scope and spirit of the embodiments. The embodiment was chosen and described in order to best explain the principles of the embodiments and the practical application, and to enable others of ordinary skill in the art to understand the various embodiments with various modifications as are suited to the particular use contemplated.

While the preferred embodiment has been described, it will be understood that those skilled in the art, both now and in the future, may make various improvements and enhancements which fall within the scope of the claims which follow. These claims should be construed to maintain the proper protection for the embodiments first described.

What is claimed is:

1. A system comprising:
    a sidecar indoor air to liquid heat exchanger that cools warm air generated by a rack of information technology equipment;
    a liquid to liquid heat exchanger;
    an outdoor heat exchanger;
    configurable pathways to connect and control fluid flow through the sidecar heat exchanger, the liquid to liquid heat exchanger, the rack of information technology equipment, and the outdoor heat exchanger based upon at least one of ambient temperature and ambient humidity to remove heat from the rack of information technology equipment;
    an interior loop passing through the sidecar heat exchanger and at least one of the liquid to liquid heat exchanger and the rack of information technology equipment;
    an exterior loop passing through the sidecar heat exchanger and the outdoor heat exchanger; and
    a bypass flow in the exterior loop; and
    wherein the fluid flow within the interior loop and the exterior loop are separate from each other.

2. The system of claim 1 wherein the ambient temperature comprises at least one of outdoor temperature and indoor temperature, the ambient humidity comprises at least one of outdoor humidity and indoor humidity, and the ambient temperature and the ambient humidity are at least one of measured and projected.

3. The system of claim 1 further comprising:
    a first coolant flowing through the sidecar heat exchanger and rack of information technology equipment during a first period of time; and
    a second coolant flowing through the sidecar heat exchanger and outdoor heat exchanger during a second period of time.

4. The system of claim 3 wherein the rack of information technology equipment is temporarily opened to use indoor air cooling during an exchange of the second coolant utilized by the sidecar heat exchanger to avoid shutting down the rack of information technology equipment.

5. The system of claim 1 wherein the sidecar heat exchanger is positioned at least one of upstream and downstream of the liquid to liquid heat exchanger.

6. The system of claim 3 wherein either the first coolant or the second coolant is removed from the sidecar heat exchanger using pressurized gas.

7. The system of claim 1 wherein the sidecar heat exchanger includes two separate sidecar heat exchangers, and one of the two sidecar heat exchangers is connected to the interior loop and the other sidecar heat exchanger is connected to the exterior loop.

8. The system of claim 1 wherein the fluid flow is controlled to flow through at least one of the interior loop and exterior loop.

9. The system of claim 1 further comprising a single set of heat transfer fins used for the interior loop and the exterior loop within the sidecar heat exchanger.

10. The system of claim 1 wherein the sidecar heat exchanger's interior loop is positioned at least one of upstream and downstream of the rack of information technology equipment.

* * * * *